US007721176B2

(12) United States Patent
Jung et al.

(10) Patent No.: US 7,721,176 B2
(45) Date of Patent: May 18, 2010

(54) METHOD, SYSTEM, AND COMPUTER PROGRAM PRODUCT FOR INTEGRATED CIRCUIT RECOVERY TESTING USING SIMULATION CHECKPOINTS

(75) Inventors: Donald Jung, Elmhurst, NY (US); John B. Aylward, Poughkeepsie, NY (US); Yuk-Ming Ng, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/951,431

(22) Filed: Dec. 6, 2007

(65) Prior Publication Data

US 2009/0150732 A1    Jun. 11, 2009

(51) Int. Cl.
*G01R 31/28* (2006.01)
*G06F 11/00* (2006.01)

(52) U.S. Cl. .................... 714/741; 714/731; 714/33; 714/34

(58) Field of Classification Search ............. 714/741, 714/742, 744, 724, 731, 799, 811, 25, 27–28, 714/31–34, 37–39, 44, 47–48
See application file for complete search history.

(56) References Cited

U.S. PATENT DOCUMENTS

| 5,146,460 | A | * | 9/1992 | Ackerman et al. | 714/33 |
| 5,630,047 | A | * | 5/1997 | Wang | 714/15 |
| 6,477,665 | B1 | * | 11/2002 | Bowman-Amuah | 714/39 |
| 7,444,568 | B2 | * | 10/2008 | Morrison et al. | 714/726 |

* cited by examiner

*Primary Examiner*—Christine T Tu
(74) *Attorney, Agent, or Firm*—Cantor Colburn LLP; Steven Chiu

(57) ABSTRACT

A method, system, and computer program product for integrated circuit recovery testing using simulation checkpoints is provided. The method includes executing an error injection test on an integrated circuit that includes a plurality of domains and latches. The error injection test includes injecting an error into one of the domains, clock stopping the domain with the error, performing fencing between the domain with the error and the other domains, and quiescing the other domains. A checkpoint is created of a state of the integrated circuit after the clock stopping, fencing and quiescing have been completed. A mainlines test of the integrated circuit is executed. The mainline test includes applying the checkpoint to the integrated circuit, and performing a recovery reset of the stopped domain. It is determined if the mainline test executed correctly and the results of the determining are output.

20 Claims, 5 Drawing Sheets

METHOD, SYSTEM, AND COMPUTER PROGRAM PRODUCT FOR INTEGRATED CIRCUIT RECOVERY TESTING USING SIMULATION CHECKPOINTS

BACKGROUND OF THE INVENTION

The present disclosure relates generally to integrated circuit test tools, and, in particular, to integrated circuit recovery testing using simulation checkpoints.

The testing of integrated circuits, such as application specific integrated circuits (ASICs), programmable logic devices (PLDs), microprocessors, microcontrollers, memory devices, and the like, includes the testing of resets such as power on reset and recovery reset. As used herein, the term power on reset refers to a full chip reset to establish the initial state of the integrated circuit. As used herein, the term recovery reset refers to a resetting of a subset of an integrated circuit to an initial state. Typically a recovery reset is applied to an area of logic that encountered an error condition. Recovery testing is often performed using a simulator interfacing with the integrated circuit being tested. As used herein, the term recovery testing refers to the testing of how well the integrated circuit is able to recover to a functional state from an error condition. The execution of a recovery test scenario can impact multiple portions of the simulation code because software queues and/or simulation expectations that have been set up during the simulation run need to be reset, and thus an in depth knowledge of the simulation code is required to implement a recovery test scenario. This can be challenging especially if the simulation code has been developed over many years with various code owners. It would be desirable to be able to reduce the coding effort required to implement a recovery test scenario.

BRIEF SUMMARY OF THE INVENTION

An exemplary embodiment includes a method for integrated circuit recovery testing using simulation checkpoints. The method includes executing an error injection test on an integrated circuit that includes a plurality of domains and latches. The error injection test includes injecting an error into one of the domains, clock stopping the domain with the error, performing fencing between the domain with the error and the other domains, and quiescing the other domains. A checkpoint is created of a state of the integrated circuit after the clock stopping, fencing and quiescing have been completed. A mainlines test of the integrated circuit is executed. The mainline test includes applying the checkpoint to the integrated circuit, and performing a recovery reset of the stopped domain. It is determined if the mainline test executed correctly and the results of the determining are output.

An additional exemplary embodiment includes a system for integrated circuit recovery testing using simulation checkpoints. The system includes a host system and a data storage device. The system includes a simulation tool for facilitating executing an error injection test on an integrated circuit that includes a plurality of domains and latches. The error injection test including injecting an error into one of the domains, clock stopping the domain with the error, performing fencing between the domain with the error and the other domains, and quiescing the other domains. A checkpoint is created of a state of the integrated circuit after the clock stopping, fencing and quiescing have been completed. A mainline test of the integrated circuit is executed. The mainline test includes applying the checkpoint to the integrated circuit, and performing a recovery reset of the stopped domain. It is determined if the mainline test executed correctly and the results are output. The data storage device stores the checkpoint.

A further exemplary embodiment includes a computer program product for integrated circuit recovery testing using simulation checkpoints. The computer program product includes a storage medium readable by a processing circuit and storing instructions for execution by the processing circuit for implementing a method. The method includes executing an error injection test on an integrated circuit that includes a plurality of domains and latches. The error injection test includes injecting an error into one of the domains, clock stopping the domain with the error, performing fencing between the domain with the error and the other domains, and quiescing the other domains. A checkpoint is created of a state of the integrated circuit after the clock stopping, fencing and quiescing have been completed. A mainlines test of the integrated circuit is executed. The mainline test includes applying the checkpoint to the integrated circuit, and performing a recovery reset of the stopped domain. It is determined if the mainline test executed correctly and the results of the determining are output.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF THE INVENTION

Exemplary embodiments, as shown and described by the various figures and the accompanying text, provide a method, system and computer program product for integrated circuit recovery testing using simulation checkpoints. The recovery checkpointing approach described herein reduces the coding effort required to implement a recovery test scenario.

Figure 1:
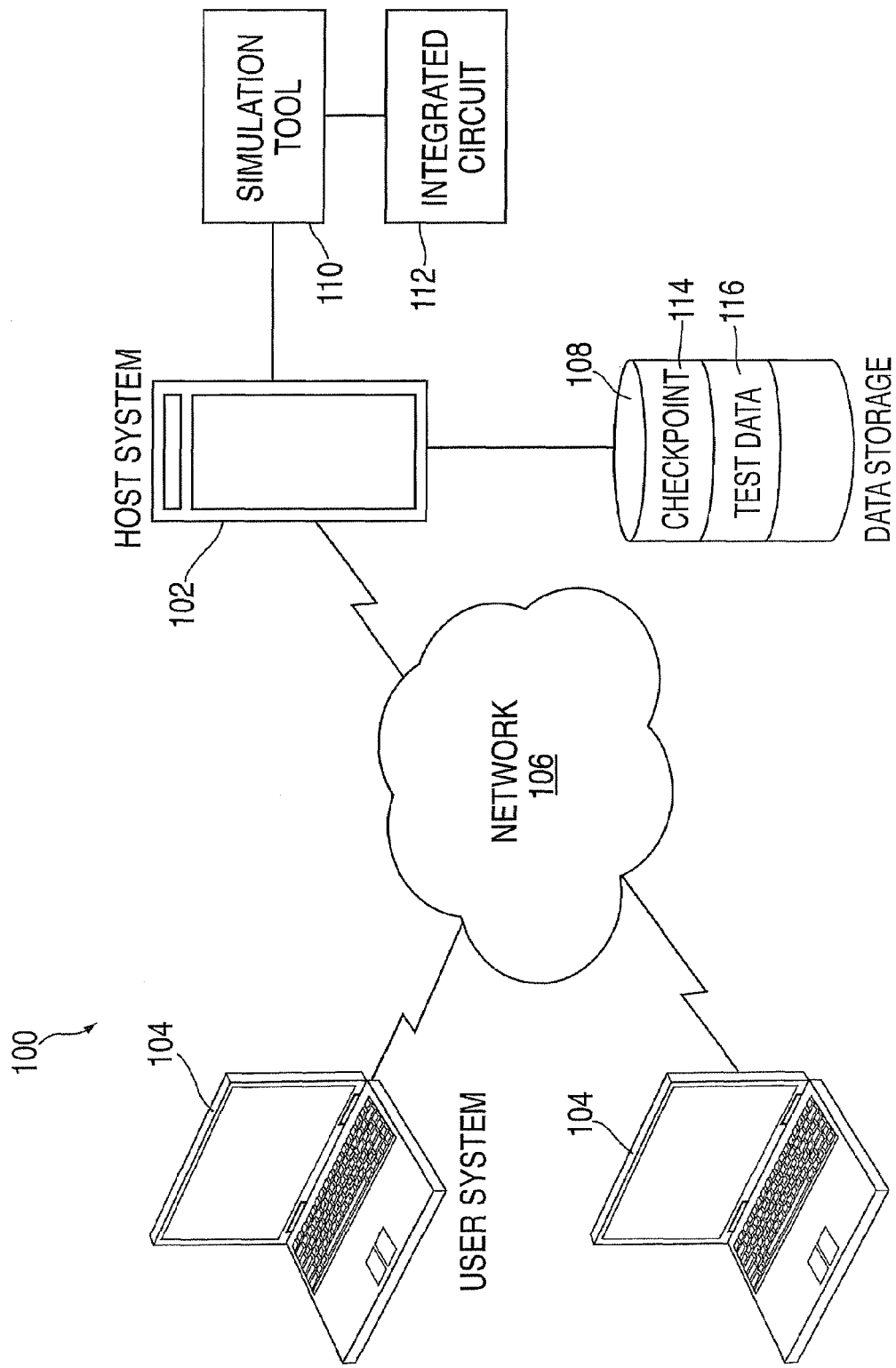
FIG. 1 depicts an exemplary system for integrated circuit recovery testing that may that may be utilized by an exemplary embodiment.

Turning now to the drawings, it will be seen that in FIG. 1 there is a block diagram of a system 100 upon which integrated circuit recovery testing using simulation checkpoints is implemented in an exemplary embodiment. The system 100 of FIG. 1 includes a host system 102 in communication with user systems 104 over a network 106. The host system 102 may be a high speed processing device (e.g., a mainframe computer), including a processing circuit for executing instructions, which handles processing requests from user systems 104. In an exemplary embodiment, the host system 102 functions as an application server and a data management server for integrated circuit recovery testing activities. User systems 104 may comprise desktop or general purpose computer devices that generate data and processing requests, such as simulation test requirements. While only a single host system 102 is shown in FIG. 1, it will be understood that multiple host systems may be implemented, each in communication with one another via direct coupling or via one or more networks. For example, multiple host systems may be interconnected through a distributed network architecture. The single host system 102 may also represent a cluster of hosts accessing a common data store, e.g., via a clustered file system that is backed by a data storage device 108. In an alternate exemplary embodiment, the host system 102 is directly user accessible without communication through the network 106, e.g., where the host system 102 is embodied in a desktop computer or workstation.

The network 106 may be any type of communications network known in the art. For example, the network 106 may be an intranet, extranet, or an internetwork, such as the Internet, or a combination thereof. The network 106 can include wireless, wired, or fiber optic links.

The data storage device 108 refers to any type of storage and may comprise one or more secondary storage elements, e.g., a hard disk drive or tape storage system that is external to the host system 102. In an alternate exemplary embodiment, the data storage device 108 is internal to the host system 102. Types of data that may be stored in the data storage device 108 include databases and/or files of checkpoint data 114 and simulation test data 116. It will be understood that the data storage device 108 shown in FIG. 1 is provided for purposes of simplification and ease of explanation and is not to be construed as limiting in scope. To the contrary, there may be multiple data storage devices utilized by the host system 102.

In an exemplary embodiment, the host system 102 executes various applications, including a simulation tool 110. Other applications, e.g., business applications, a web server, etc., may also be implemented by the host system 102 as dictated by the needs of the enterprise of the host system 102. The simulation tool 110 interacts with databases and/or files stored on the data storage device 108, such as the checkpoint data 114 and the test data 116. All or a portion of the simulation tool 110 may be located on the user systems 104 with processing shared between the user systems 104 and the host system 102, e.g., a distributed computing architecture. In addition, all or a portion of the data utilized by the simulation tool 110 may be located on the user systems 104.

In an exemplary embodiment, the user systems 104 access the host system 102 to request simulation tests and to specify parameters of simulation tests while testing an integrated circuit 112. In an exemplary embodiment, the integrated circuit 112 being tested is coupled to the simulation tool 110. The simulation tool 110 drives test data into the integrated circuit 112 and receives the results of the tests. In an alternate exemplary embodiment, the integrated circuit 112 is coupled to the user system 104 for receiving test instructions and for outputting test results. The simulation tool 110 may be implemented as a stand alone application, a plug in, a module, or an executable script in a testing environment.

Figure 2:
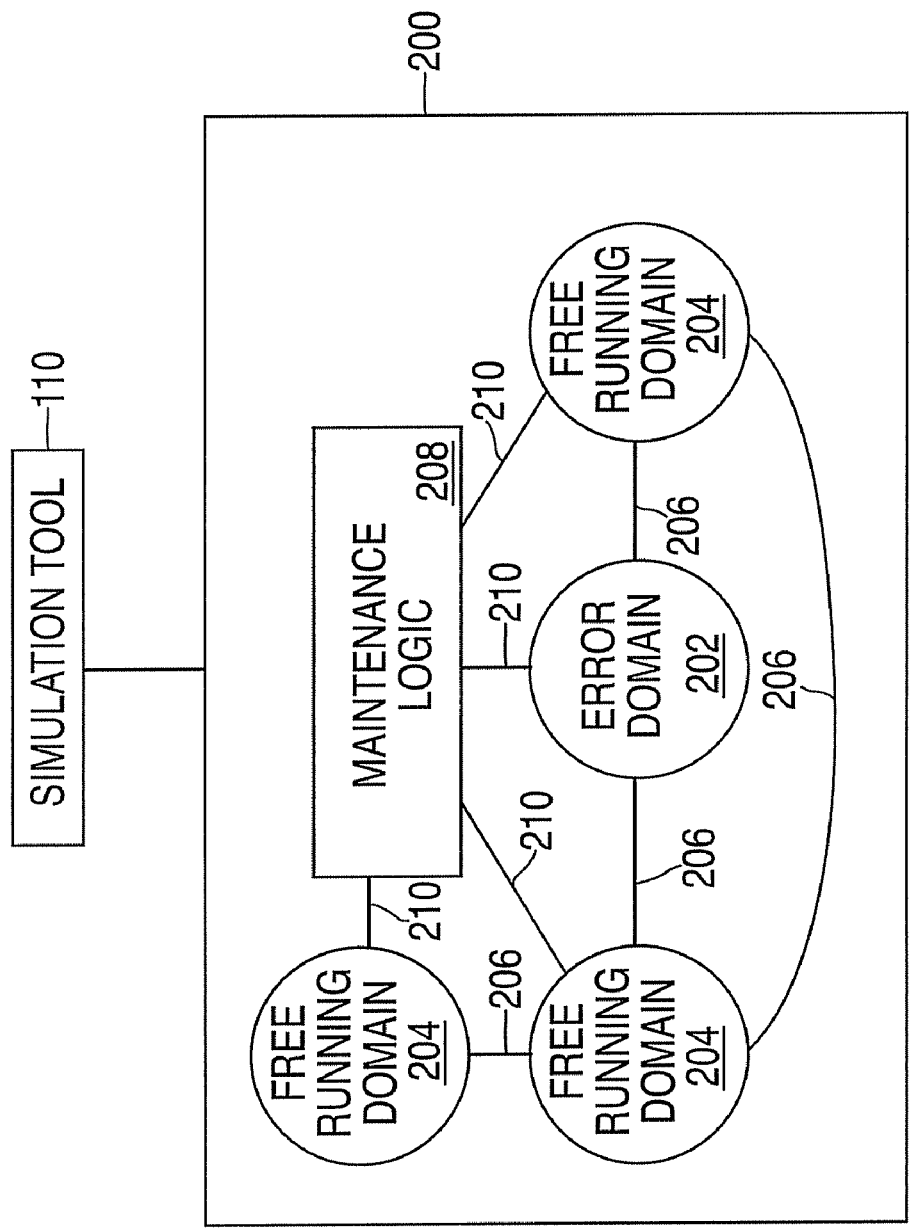
FIG. 2 depicts an exemplary integrated circuit with maintenance logic and a plurality of domains.

Turning now to FIG. 2, an exemplary integrated circuit 200 is depicted. The integrated circuit 200 includes maintenance logic 208 and four domains (with functional logic) with a functional interface 206 between one or more of the domains. As used herein, the term domain refers to a functionally distinct area of logic in the integrated circuit. The simulation tool 110 can access internal resources in the integrated circuit model. The maintenance logic 208 communicates via a maintenance interface 210 to each of the domains. The maintenance logic within the integrated circuit is responsible for error handling, clocking controls and reset controls. In the example depicted in FIG. 2, during testing, one of the domains is an error domain 202 that contains the logic with the error and three of the domains are free running domains 204.

The exemplary integrated circuit 200 is a simplified diagram intended to illustrate that integrated circuits have maintenance logic 208, a plurality of domains (containing functional circuitry/logic), each domain interfacing to one or more other domains, and that during testing some of the domains may be clock stopped (e.g., due to an error occurring in the domain) while others remain running (e.g., they do not contain an error). As used herein, the term clock stopped refers to the stopping of functional clocks to one or more logic domains.

In an exemplary embodiment, there are various types of resets that are tested via the simulation tool 110. Aside from an initial power on reset, there are recovery resets that reset certain domains that are clock stopped due to error conditions. The recovery reset is required to allow the integrated circuit 112 to return a functional state (e.g., via the maintenance logic) such that log information may be passed to host system 102. Any section of the integrated circuit 112 that was in a clock stopped state will be reset by the recovery reset and the clocks will automatically be started. There will be sections of the integrated circuit 112 that will continue to be free running and functional while the error domain is clock stopped. These free running sections are fenced from the clock stopped domain so that the act of scanning the clock stopped domain does not "leak" across the two domains.

When a hard error is detected in a clock stoppable domain, a clock stop request is generated by the integrated circuit logic. The maintenance logic then informs all functional islands (i.e., domains) that a stop clock condition is pending. Upon receiving a clock stop pending signal, all functional islands in the integrated circuit should gracefully terminate the transactions in their external interfaces and return to their quiesce state.

After the external interfaces have been quiesced, each functional island informs the maintenance logic the clocks can be stopped. The values of the latches in the clock stopped domain can then be scanned by the maintenance logic and output to the data storage device 108 as test data 116 and/or communicated to a user system 104 or the host system 102. Once this scanning is completed, a recovery reset can be issued to restart the clock stopped domain.

Figure 3:
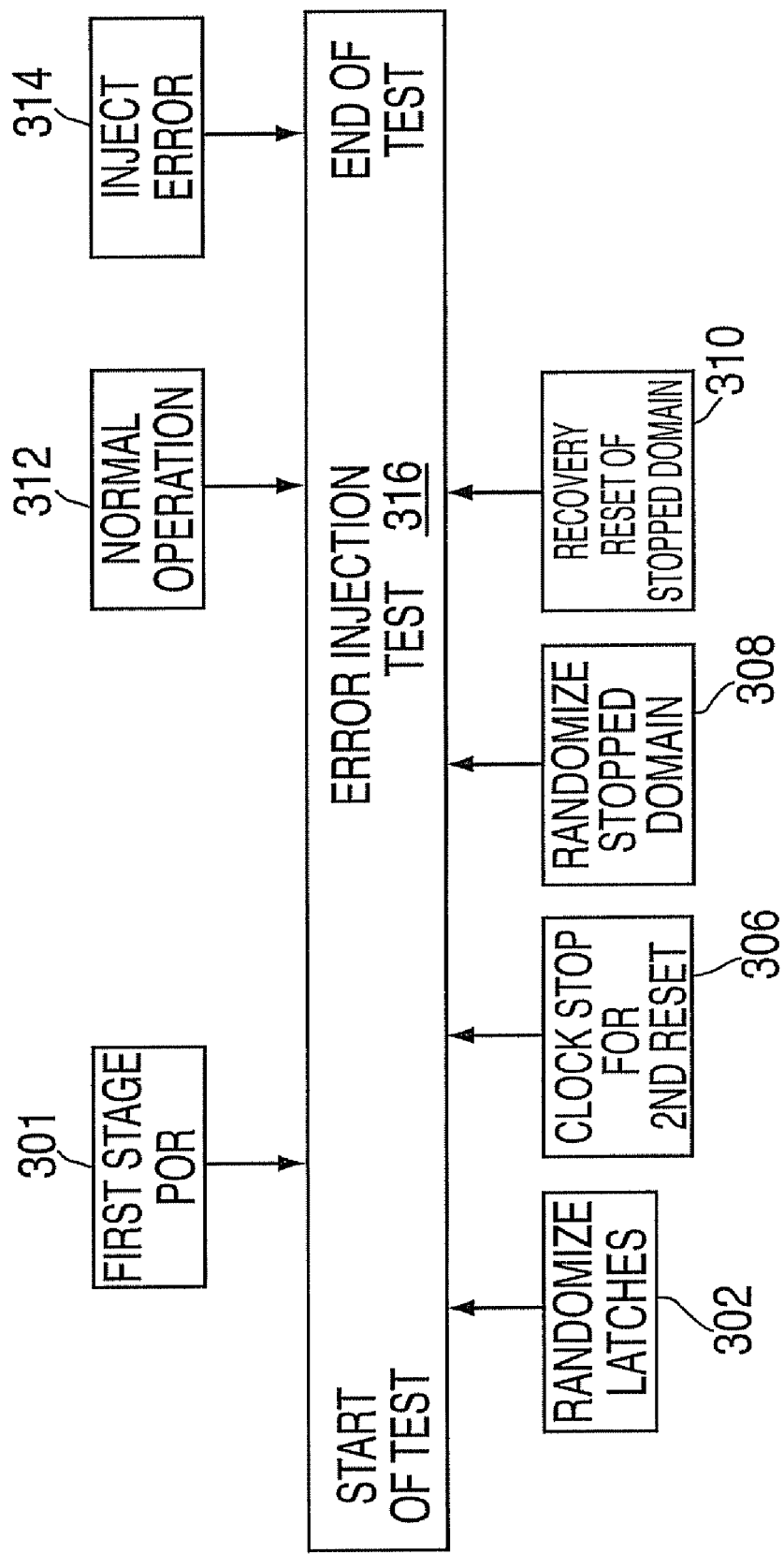
FIG. 3 depicts an exemplary process flow of an error injection test.

FIG. 3 depicts an exemplary process for performing an error injection test 316 on an integrated circuit. As used herein, the term error injection test refers to the forcing of an error condition into the integrated circuit using the simulation tool. In an exemplary embodiment, the process depicted in FIG. 3 is driven by the simulation tool 110 in response to input from the user system 104 or in response to the test data 116. The simulation tool 110 interfaces to the integrated circuit 112. In an exemplary embodiment, the simulation tool 110 tests the various integrated circuit reset functions in two stages. Both of these reset stage tests are performed prior to integrated circuit configuration and mainline operation. The first stage is the power on reset test. The second stage reset randomly chooses between performing a recovery reset test or skipping the recovery reset test.

Referring to FIG. 3, at block 302 all of the latches on the integrated circuit 112 are randomized and at block 301, the integrated circuit power-on reset is applied to complete execution of the power on reset test of the first stage. The integrated circuit 112 is then taken out of reset and the simulation continues to the second stage reset phase. During the second stage phase, the recovery reset of the integrated circuit may be performed. If recovery reset is randomly selected, the test proceeds to block 312. If recovery reset is selected, then a domain associated with the recovery reset is clock stopped at block 306. When a domain is to be clock stopped, the domains that are not clock stopped will quiesce and a fence will be raised between the domains. Quiescing a domain includes gracefully terminating any ongoing operations and returning the domain to an idle state. A fence indication informs a domain to ignore any functional activity from an adjoining domain. The domain(s) that is not clock stopped is called a free running domain and the domain that is clock stopped is called an error domain. Once the fence is raised, block 308 is performed to randomize the latches in the clock stopped domain(s). At block 310, the reset for the clock stopped domain is then released and the simulation continues on to block 312. At block 312, normal operation is performed starting with an integrated circuit configuration phase. Because this is an error injection test 316, at block 314 an error is injected, followed by a recovery from the injected error.

This method of reset testing ensures that the latches in the particular reset domain(s) are reset properly. It also tests that the logic that is not in the reset domain(s) is properly fenced from the domain(s) being randomized. Randomized data could leak over to the free running domains if a fence is not properly applied. This type of error would eventually appear as a power on check error or some other mainline error condition.

This method of reset testing described in reference to FIG. 3 is that during the second stage reset, the free running logic is in an initialized state at the time the resettable domain is clock stopped. That is, the resettable domain should be clock stopped at random times while the integrated circuit 112 is in an active running state. By clock stopping at random points, scenarios where the free running domains may not be properly quiescing and be left in an incorrect state may be detected. If the free running logic is left in an incorrect state, the integrated circuit 112 may not be able to recover to normal operation after the clock stopped domain is brought out of reset.

In setting up for this type of test, the simulation code on the simulation tool 110 needs to also be reset to an initial state. During normal operation at block 312, the simulation code is continually setting up and queuing up data transfers and the expectations for these operations. Internal registers are monitored for expected status indications. Interface monitors are set up for expectations based on the address and data scoreboarding for the enqueued operations.

If the simulation tool 110 were to attempt to perform a recovery test, the simulation code would also need to account for the hardware recovery and clear up all software queues and expectations that were set up prior to the recovery action.

In an exemplary embodiment, a recovery test takes advantage of the simulation reset staging described in reference to FIG. 3 to cleanly avoid the process of clearing up all the code expectations.

Figure 4:
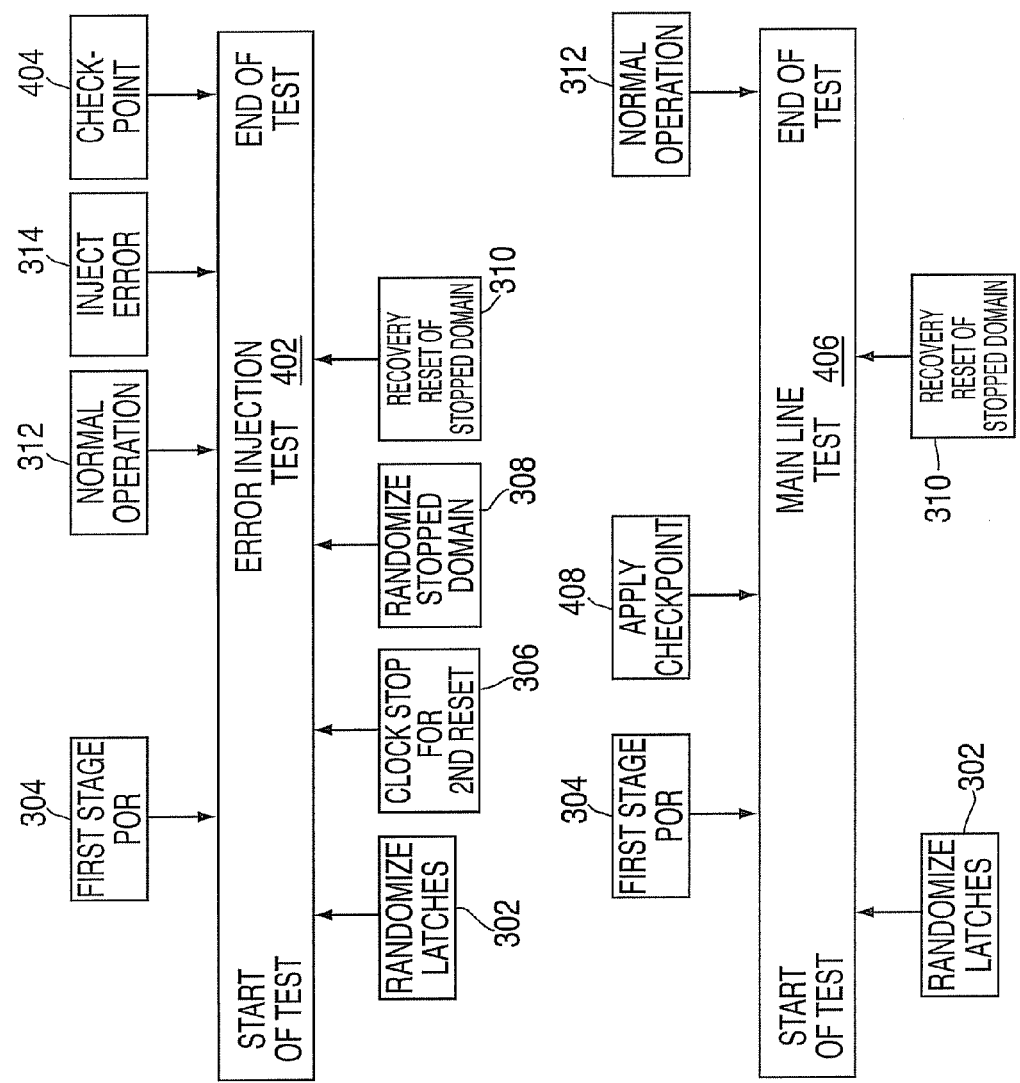
FIG. 4 depicts an exemplary process flow of an error injection test and a mainline test that may be implemented by an exemplary embodiment.

FIG. 4 depicts the use of a checkpoint taken for an error injection test 402 being utilized as input to a recovery reset in a mainline test 406. As used herein, the term mainline test refers to the testing of the specific functional requirements of the integrated circuit. As depicted in FIG. 4, a simulation checkpoint file is created at block 404 to capture the state of the logic at the time an error is injected at block and the error domain is clock stopped. The error domain remains clock stopped until a recovery reset is applied to the domain. The free running domains continue operation but in a quiesced state with fencing between the free running and clock stopped domains. This state is similar to the second stage reset simulation phase described above (e.g., blocks 306-310). The checkpoint is taken of the hardware after the error is injected, and the fencing and quiescing are completed. In an exemplary embodiment, creating a checkpoint of a state of an integrated circuit includes copying the values of the latches in the integrated circuit into a checkpoint file. The checkpoint taken at block 404 is applied, at block 408, to the start of a new simulation run at the time the secondary stage reset is being executed. At this point, the simulation code is still in its initial state. That is, no operations, software queues or expectations have been set up yet. After the checkpoint files is loaded at block 408, the recovery reset is applied to the clock stopped domain at block 310 to start the clocks again and normal integrated circuit bring up continues. During this new simulation run, the free running domains will resume from the state during which the error inject/clock stopped occurred. From a simulation code standpoint, rerunning from a checkpoint from the second stage reset leaves the process of verifying the hardware recovery behavior independent of the prior history of simulation expectations.

Figure 5:
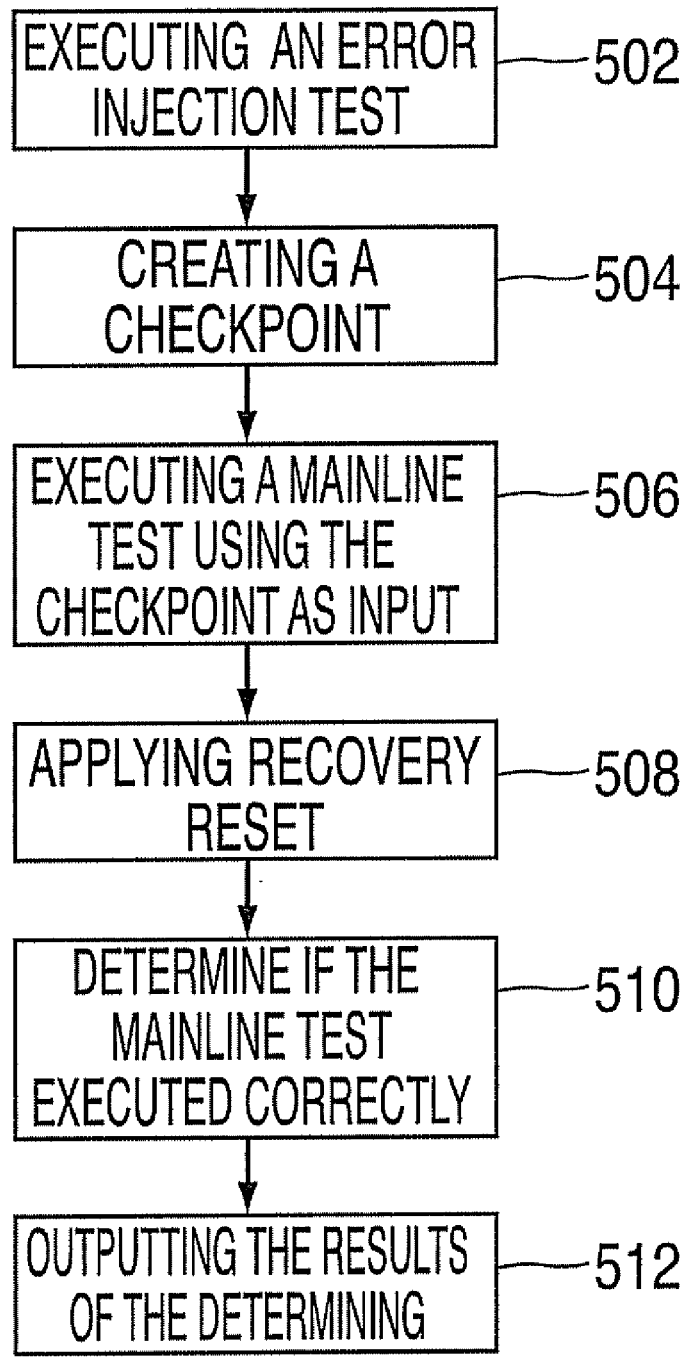
FIG. 5 depicts an exemplary process flow for integrated circuit recovery testing using simulation checkpoints that may be implemented by an exemplary embodiment.

FIG. 5 summarizes the process flow described above for integrated circuit recovery testing using simulation checkpoints that may be implemented by an exemplary embodiment. At block 502, an error injection test is executed as described above. The error injection test includes injecting an error into one of the domains on the integrated circuit 112. In response to the error being injected, the domain with the error is clock stopped and fencing is performed between the domain with the error and the other domains. In addition, the other domains are quiesced. At this point, a checkpoint of the state of the integrated circuit is created at block 504. At block 506, a mainline test of the integrated circuit 112 is executed using the checkpoint as input. The executing includes applying the checkpoint to the integrated circuit 112. The integrated circuit 112 will then be in the same state that it was when the checkpoint was created at block 504. Once the checkpoint is applied, a recovery reset of the stopped domain is then performed at block 508. At block 510, it is determined if the mainline test executed correctly. In an exemplary embodiment, the determining is performed by extracting the values of one or more of the latches in the integrated circuit 112 and comparing the values to expected results. At block 512, the results of the determining are output. In an exemplary embodiment, the results are output to the host system 102 and stored as test data 116 in the data storage device. In another embodiment, the results are output to a tester via the simulation tool 110 and/or one of the user systems 104.

Technical effects include the ability to take advantage of the existing simulation software test sequencing by using a checkpoint file during a second stage reset to uncover hardware quiescing and fencing issues that may arise during an error and clock stop scenario. During an error induced clock stop scenario, free running domains should gracefully terminate the transactions. If these free running domains are left in an incorrect state, the checkpoint file will retain this state and errors caused by this state will surface after the secondary stage reset is performed. The checkpoint file will be generated from simulation runs where the error condition is injected at random points. This random error injection allows recovery testing to be performed at times when the free running domains are in an active, non idle state.

As described above, embodiments can be embodied in the form of computer-implemented processes and apparatuses for practicing those processes. In an exemplary embodiment, the invention is embodied in computer program code executed by one or more network elements. Embodiments include computer program code containing instructions embodied in tangible media, such as floppy diskettes, CD-ROMs, hard drives, universal serial bus (USB) drives, or any other computer-readable storage medium, wherein, when the computer program code is loaded into and executed by a computer, the computer becomes an apparatus for practicing the invention. Embodiments include computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for integrated circuit recovery testing using simulation checkpoints, the method comprising:
    executing an error injection test on an integrated circuit that includes a plurality of domains and latches, the error injection test including injecting an error into one of the domains, clock stopping the domain with the error, performing fencing between the domain with the error and the other domains, and quiescing the other domains;
    creating a checkpoint of a state of the integrated circuit after the clock stopping, fencing and quiescing have been completed;
    executing a mainline test of the integrated circuit, the mainline test including:
        applying the checkpoint to the integrated circuit; and
        performing a recovery reset of the stopped domain;
    determining if the mainline test executed correctly; and
    outputting the results of the determining.

2. The method of claim 1 further comprising performing a power on reset of the integrated circuit prior to executing the error injection test.

3. The method of claim 2 wherein the power on reset includes:
    randomizing the latches in the plurality of domains;
    resetting the latches; and
    verifying that the latches were reset properly.

4. The method of claim 1 further comprising performing normal operations of the integrate circuit prior to executing the error injection test.

5. The method of claim 1 wherein the checkpoint includes the state of the latches on the integrated circuit.

6. The method of claim 1 wherein the method is performed by a simulation tool interfacing to the integrated circuit.

7. The method of claim 1 wherein the determining is performed by comparing actual results of the mainline test to expected results of the mainline test.

8. A system for integrated circuit recovery testing using simulation checkpoints, the system comprising:
    a host system executing a simulation tool, the simulation tool facilitating:
        executing an error injection test on an integrated circuit that includes a plurality of domains and latches, the error injection test including injecting an error into one of the domains, clock stopping the domain with the error, performing fencing between the domain with the error and the other domains, and quiescing the other domains;
        creating a checkpoint of a state of the integrated circuit after the clock stopping, fencing and quiescing have been completed;
        executing a mainline test of the integrated circuit, the mainline test including:
            applying the checkpoint to the integrated circuit; and
            performing a recovery reset of the stopped domain;
        determining if the mainline test executed correctly; and
        outputting the results of the determining; and
    a data storage device storing the checkpoint.

9. The system of claim 8 wherein the simulation tool further facilitates performing a power on reset of the integrated circuit prior to executing the error injection test.

10. The system of claim 9 wherein the power on reset includes:
    randomizing the latches in the plurality of domains;
    resetting the latches; and
    verifying that the latches were reset properly.

11. The system of claim 8 wherein the simulation tool further facilitates performing normal operations of the integrate circuit prior to executing the error injection test.

12. The system of claim 8 wherein the checkpoint includes the state of the latches on the integrated circuit.

13. The system of claim 8 wherein the simulation tool interfaces to the integrated circuit.

14. The system of claim 8 wherein the determining is performed by comparing actual results of the mainline test to expected results of the mainline test.

15. A computer program product for integrated circuit recovery testing using simulation checkpoints, the computer program product comprising:
    a storage medium readable by a processing circuit and storing instructions for execution by the processing circuit for implementing a method, the method comprising:
        executing an error injection test on an integrated circuit that includes a plurality of domains and latches, the error injection test including injecting an error into one of the domains, clock stopping the domain with the error, performing fencing between the domain with the error and the other domains, and quiescing the other domains;
        creating a checkpoint of a state of the integrated circuit after the clock stopping, fencing and quiescing have been completed;
        executing a mainline test of the integrated circuit, the mainline test including:
            applying the checkpoint to the integrated circuit; and
            performing a recovery reset of the stopped domain;
        determining if the mainline test executed correctly; and
        outputting the results of the determining.

16. The computer program product of claim 15 wherein the method further comprises performing a power on reset of the integrated circuit prior to executing the error injection test.

17. The computer program product of claim 16 wherein the power on reset includes:
    randomizing the latches in the plurality of domains;
    resetting the latches; and
    verifying that the latches were reset properly.

18. The computer program product of claim 15 wherein the method further comprises performing normal operations of the integrate circuit prior to executing the error injection test.

19. The computer program product of claim 15 wherein the checkpoint includes the state of the latches on the integrated circuit.

20. The computer program product of claim 15 wherein the method is performed by a simulation tool interfaces to the integrated circuit.

* * * * *